US007675299B2

(12) United States Patent
Lane

(10) Patent No.: US 7,675,299 B2
(45) Date of Patent: Mar. 9, 2010

(54) METHOD AND APPARATUS FOR MAKING A DETERMINATION RELATING TO RESISTANCE OF PROBES

(75) Inventor: Frederick J. Lane, Ceres, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/396,659

(22) Filed: Mar. 3, 2009

(65) Prior Publication Data

US 2009/0160464 A1    Jun. 25, 2009

Related U.S. Application Data

(62) Division of application No. 11/466,145, filed on Aug. 22, 2006, now Pat. No. 7,498,824.

(51) Int. Cl.
*G01R 27/14* (2006.01)
*G01R 27/08* (2006.01)
(52) U.S. Cl. .................. 324/715; 324/713; 324/761
(58) Field of Classification Search .......... 324/715–718
See application file for complete search history.

(56) References Cited

U.S. PATENT DOCUMENTS

| 4,667,149 | A | * | 5/1987 | Cohen et al. ............. 324/715 |
| 4,698,584 | A | * | 10/1987 | Morin ...................... 324/715 |
| 5,217,907 | A | | 6/1993 | Bulucea et al. |
| 5,365,180 | A | | 11/1994 | Edelman |
| 5,804,979 | A | * | 9/1998 | Lund et al. ............... 324/713 |
| 6,084,418 | A | * | 7/2000 | Takami et al. ............ 324/717 |
| 6,323,661 | B1 | | 11/2001 | Wildes et al. |
| 6,917,208 | B2 | | 7/2005 | Lindolf et al. |
| 7,498,824 | B2 | | 3/2009 | Lane |
| 2004/0008043 | A1 | | 1/2004 | Thomas et al. |
| 2004/0093716 | A1 | | 5/2004 | Gleason et al. |

OTHER PUBLICATIONS

A Microcontroller Based Digital Lock-In Milliohmmeter (Printout Website Applicant Referred in the IDS Mar. 5, 2009).*
Int'l Preliminary Report On Patentability, PCT application PCT/US2007/076346 (Mar. 5, 2009), 6 pages.
Int'l Search Report and Written Opinion, PCT application PCT/US2007/076346 (Dec. 11, 2007), 10 pages.
Cappel, A Microcontroller Based Digital Lock-In Milliohmmeter (available at http:/cappels.org/dproj/dlmom/dlmom.html) (2003).

* cited by examiner

*Primary Examiner*—Vincent Q Nguyen
(74) *Attorney, Agent, or Firm*—N. Kenneth Burraston

(57) ABSTRACT

According to some embodiments, a method of determining a resistance of probes on a contactor device is disclosed. The contactor device can include a plurality of probes disposed to contact an electronic device to be tested. The method can include electrically connecting a pair of the probes to each other, and then forcing one of a voltage onto or a current through the pair of the probes. At a location on the contactor device, the other of a voltage across or a current through the pair of the probes can be sensed. A determination relating to a resistance of the probes can be determined from the values of the forced voltage or current and sensed other of the voltage or current.

24 Claims, 9 Drawing Sheets

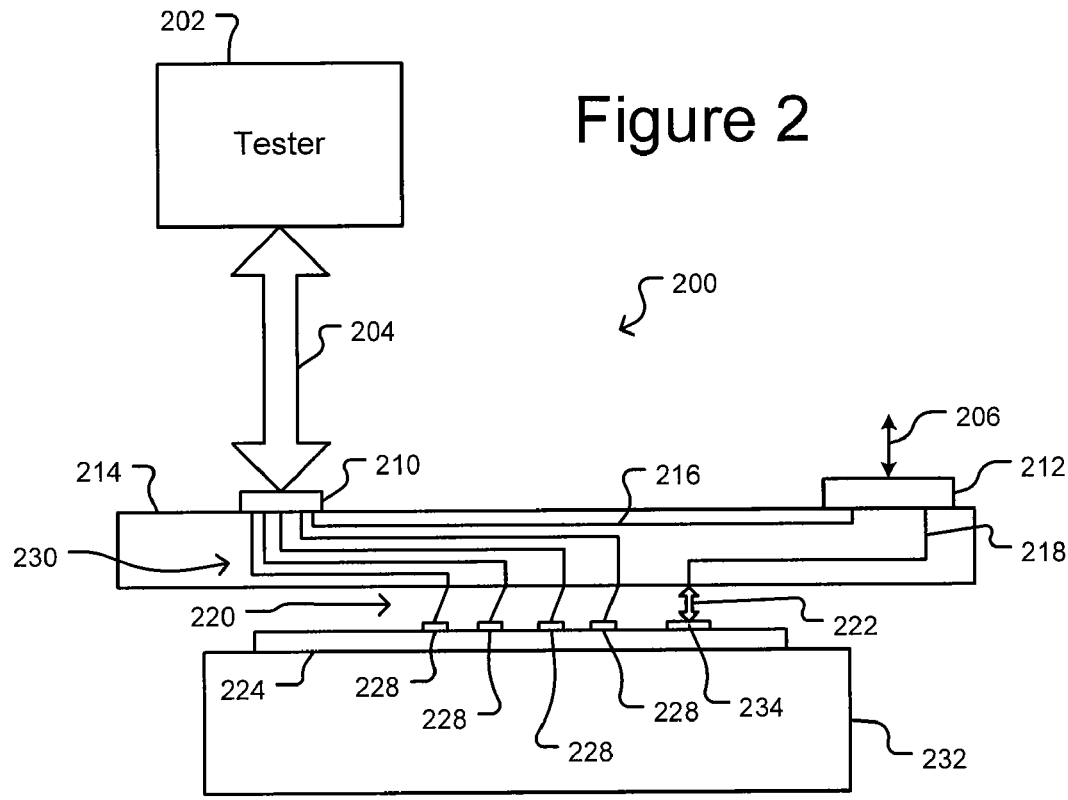
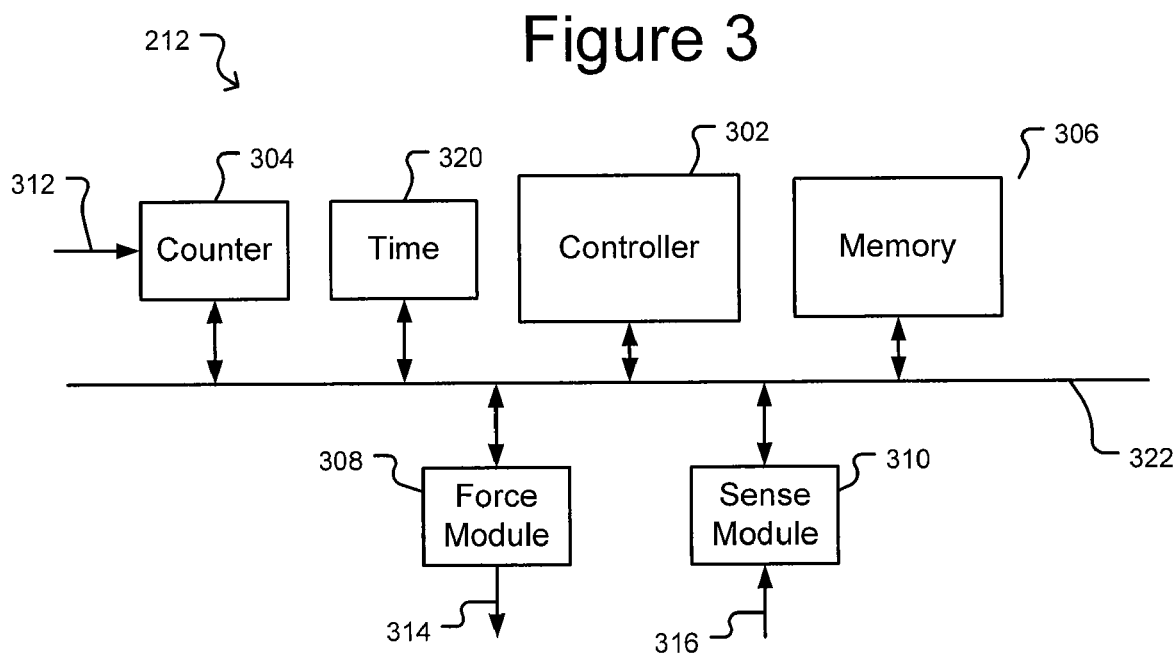

METHOD AND APPARATUS FOR MAKING A DETERMINATION RELATING TO RESISTANCE OF PROBES

CROSS-REFERENCE TO RELATED APPLICATION(S)

This application is a division of U.S. patent application Ser. No. 11/466,145, filed Aug. 22, 2006 (now U.S. Pat. No. 7,498,824). The foregoing U.S. patent application Ser. No. 11/466,145 is incorporated herein by reference in its entirety.

BACKGROUND

FIG. 1 illustrates a prior art test system 100 for testing dies of a semiconductor wafer 130. A semiconductor wafer 130 comprising a plurality of dies is placed on a moveable chuck 134 inside a prober 132 (which is shown in FIG. 1 with cut away 136 showing an interior 132 of the prober 132). The chuck 134 is moved to align terminals 118 of the dies with probes 116 of a probe card assembly 114, and then the chuck 134 is moved towards the probes 116 until terminals 118 are pressed against and form electrical connections with the probes 116.

Cable 104, test head 106, electrical connectors 108, and probe card assembly 114 include electrical paths that form a plurality of communications channels (not shown) between the tester 102 and individual probes 116. Once probes 116 are in contact with and thus electrically connected to die terminals 118, a tester 102 generates test signals that are communicated through the aforementioned communications channels (not shown) to dies of the semiconductor wafer 130. Response data generated by the dies of the semiconductor wafer 130 is communicated through the communications channels to the tester 102, which can evaluate whether the dies of the wafer 130 function properly.

Due, among other reasons, to the accumulation of debris on the probes 116, the electrical resistance of the probes 116 (which may be termed the "contact resistance" of the probes 116) can increase over time. As the contact resistance of the probes 116 increases, so does the risk that good dies of wafer 130 fail the testing not because the dies are faulty but because the contact resistance of the probes 116 interferes with the passage of test signals to and response signals from the dies.

It has been known to electrically connect two of the probes 116 to one input and/or output terminal 118 and then drive from drivers (not shown) in the tester 102 a current onto one of the two communications channels (each comprising electrical paths through cable 104, test head 106, connectors 108, and probe card 114) that connect the tester 102 to the two probes 116 and to measure, also at the tester 102, the voltage drop between those two communications channels. As is known from Ohm's law, the voltage drop between the two communications channels is equal to the product of the current driven onto the one of the two communications channels (and returned by the other of the communications channels) and the resistance of the two communications channels, the two probes 116, and the terminal 118 against which the probes 116 are pressed. The resistance of the two communications channels, the two shorted probes 116, and the terminal 118 against which the two probes 116 are pressed is thus the quotient of the voltage drop between the two channels divided by the current driven onto the one of the two channels.

It has been known to periodically determine the resistance of the two communications channels, the two probes 116, and the terminal 118 in order to track variations in that resistance. The usefulness of such determinations is limited, however, for several reasons. For example, the contact resistance of the two probes 116 pressed against the terminal 118 is often but a small part of the determined resistance, which as discussed above, also includes, among others, the resistance of the two communications channels connected to the two probes 116. Indeed, cable 104 is often many feet long. As another example, it has been difficult to obtain precise measurements of current and voltage at the tester 102. As yet another example, input and/or output circuitry, buffering circuitry, electrostatic discharge circuitry, etc. associated with the terminal 118 can affect significantly the current or voltage put onto the communications channels, which can significantly distort determination of the resistance. In some embodiments, the present invention provides improved methods, techniques, and apparatuses for determining information relating to contact resistance of probes in test systems like the semiconductor wafer test system 100 of FIG. 1 or any test system in which probes make electrical connections with a device being tested.

SUMMARY

According to some embodiments, a method of determining a resistance of probes on a contactor device is disclosed. The contactor device can include a plurality of probes disposed to contact an electronic device to be tested. The method can include electrically connecting a pair of the probes to each other, and then forcing one of a voltage onto or a current through the pair of the probes. At a location on the contactor device, the other of a voltage across or a current through the pair of the probes can be sensed. A determination relating to a resistance of the probes can be determined from the values of the forced voltage or current and sensed other of the voltage or current.

In some embodiments, a probe card assembly can comprise a structure and an electrical interface disposed on the structure. The electrical interface can be configured to make electrical connections with communications channels to a tester. Probes can be disposed on the structure. Ones of the probes can be electrically connected to the electrical interface and can be disposed to contact an electronic device to be tested. The probe card assembly can also include a forcing means for forcing one of a voltage onto or a current through a pair of the probes and a sensing means for sensing the other of a voltage across or a current through the pair of the probes.

BRIEF DESCRIPTION OF THE DRAWINGS

FIG. 2 illustrates a simplified block diagram of an exemplary test system in which electrically conductive probes can make electrical connections with a device under test according to some embodiments of the invention.

FIG. 3 illustrates a simplified block diagram of the measurement module in FIG. 2 according to some embodiments of the invention.

DETAILED DESCRIPTION OF EXEMPLARY EMBODIMENTS

Figure 1:
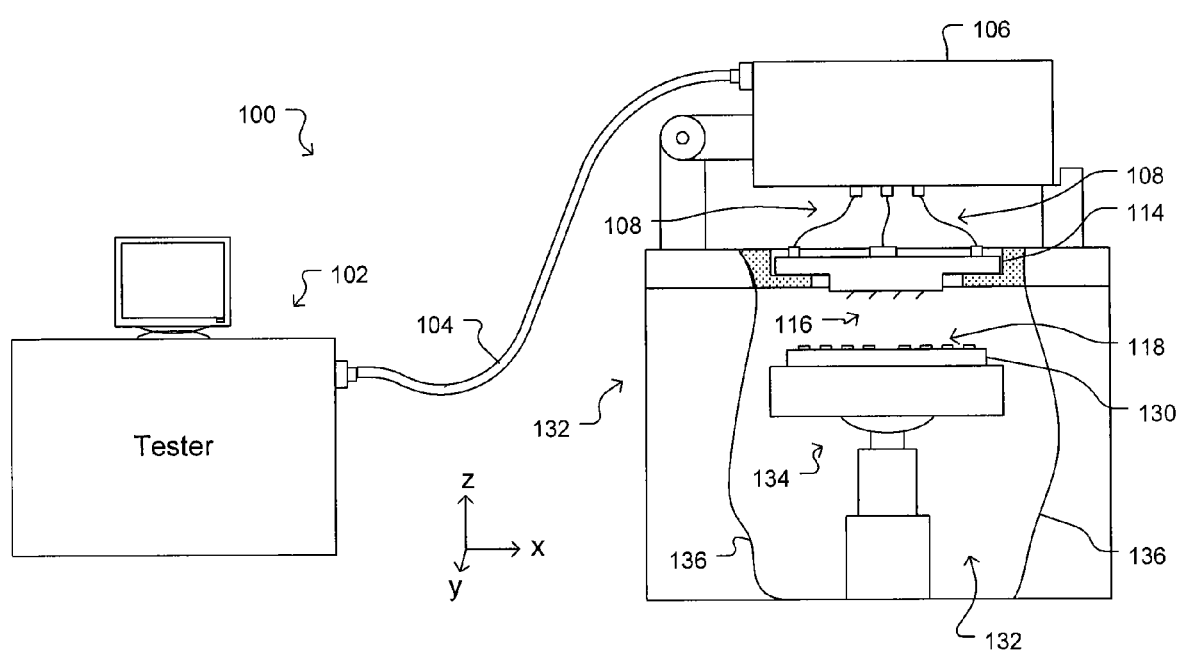
FIG. 1 illustrates a prior art test system for testing dies of a semiconductor wafer.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the term "on" is used herein, one object (e.g., a material, a layer, a substrate, etc.) can be "on" another object regardless of whether the one object is directly on the other object or there are one or more intervening objects between the one object and the other object. Also, directions (e.g., above, below, top, bottom, side, "x," "y," "z," etc.), if provided, are relative and provided solely by way of example and for ease of illustration and discussion and not by way of limitation.

FIG. 2 illustrates a simplified block diagram of an exemplary test system 200 that can test one or more electronic devices under test 224. (Hereinafter one or more electronic devices under test are referred to as a DUT, which can be without limitation one or more dies of an unsingulated semiconductor wafer, one or more semiconductor dies singulated from a wafer (packaged or unpackaged), one or more dies of an array of singulated semiconductor dies (packaged or unpackaged) disposed in a carrier or other holding device, one or more multi-die electronics modules, one or more printed circuit boards, and/or any other type of electronic device or devices.) As shown, the system 200 can include a tester 202, communications channels 204, and a contactor device 214 that includes electrically conductive probes 220, 222 and a measurement module 212.

The tester 202 can generate test signals to be input into the DUT 224, and tester 202 can also evaluate response signals generated by the DUT 224 in response to the test signals. Tester 202 can comprise equipment such as one or more programmed computers. The tester 202 can be electrically connected to the DUT 224 through a plurality of communications channels 204 and the contactor device 214. The communications channels 204 can be a plurality of electrical paths between the tester 202 and an electrical interface 210 on the contactor device 214. Any mechanism or medium can be used to provide the communications channels 204. For example, communications channels 204 can comprise coaxial cables, fiber optics, wireless transmitters and receivers, twisted pairs, electric circuits, driver circuits, receiving circuits, etc. Moreover, each of channels 204 can comprise multiple medias. For example, ones of channels 204 can comprise a driver circuit that drives a signal down a coaxial cable to routing circuits on one or more circuit boards, which in turn can provide the signal to an electrical connector that can be connected to an electrical interface 210 on the contactor device 214.

As shown, the contactor device 214 can comprise an electrical interface 210 and a plurality of electrically conductive probes 220, 222. The electrical interface 210 can comprise any mechanism for providing electrical connections to the communications channels 204. For example, the electrical interface 210 can comprise zero-insertion-force ("ZIF") electrical connectors configured to receive mating ZIF connectors (not shown) at the ends of the communications channels 204. As another non-limiting example, electrical interface 210 can comprise pogo pin pads configured to receive pogo pin electrical connectors at the end of communications channels 204. A plurality of electrical paths 230 can provide electrical connections between the electrical interface 210 and ones of the probes 220. The contactor device 214 can comprise one or a plurality of substrates. For example, the contactor device 214 can be like the probe card assembly 700 of FIG. 9. Ones of the probes 220 can be disposed in a pattern that corresponds to a pattern of input and/or output terminals 228 of the DUT 224. (There may be more terminals 228 than probes 220, in which case, elements of DUT 224 associated with subsets of the terminals 228 can be sequentially contacted and tested.)

The probes 220, 220 can be resilient, conductive structures. Non-limiting examples of suitable probes 220, 220 include composite structures formed of a core wire bonded to a conductive terminal (not shown) on the contactor device 214, and the core wire can be over coated with a resilient material as described in U.S. Pat. No. 5,476,211, U.S. Pat. No. 5,917,707, and U.S. Pat. No. 6,336,269. Probes 220 can alternatively be lithographically formed structures, such as the spring elements disclosed in U.S. Pat. No. 5,994,152, U.S. Pat. No. 6,033,935, U.S. Pat. No. 6,255,126, U.S. Pat. No. 6,945,827, U.S. Patent Application Publication No. 2001/0044225, and U.S. Patent Application Publication No. 2004/0016119. Still other non-limiting examples of probes 220, 222 are disclosed in U.S. Pat. No. 6,827,584, U.S. Pat. No. 6,640,432, U.S. Pat. No. 6,441,315, and U.S. Patent Application Publication No. 2001/0012739. Other non-limiting examples of probes 220, 220 include electrically conductive pogo pins, bumps, studs, stamped springs, needles, buckling beams, etc.

Ones of the channels 204 can thus be electrically connected to ones of the probes 220 and thus to terminals 228 of the DUT 224 that are in contact with—and thus electrically connected to—the probes 220. A plurality of DUTs 224 can be tested as follows. A DUT 224 can be placed on a moveable holding mechanism 232, which can press ones of the terminals 228 of the DUT 224 into contact with ones of the probes 220. The tester 202 can then drive test signals through communications channels 204 to the contactor device 214. The test signals can be provided through the contactor device 214 to the probes 220 in contact with ones of the terminals 228 (e.g., input terminals) and thus into the DUT 224. Response signals generated by the DUT 224 can be provided through probes 220 in contact with ones of the terminals 228 (e.g., output terminals) to the contactor device 214. The response signals can then be sent through communications channels 204 to the tester 202. The tester 202 can evaluate the response signals and, among other things, determine whether the DUT 224 passed the testing.

If there are more terminals 228 than probes 220, the holding mechanism 232 can reposition the DUT 224 such that other terminals 228 are brought into contact with ones of the probes 220, after which the tester 202 can again generate test signals that are input into the DUT 224, and the tester 202 can evaluate response signals generated by the DUT in response to the test signals. The holding mechanism 232 can continue to reposition the DUT 224 until the entire DUT 224 is tested. For example, if DUT 224 comprises a plurality of semiconductor dies, the holding mechanism 232 can position the DUT 224 such that terminals 228 of one or more of the dies contact the probes 220, and the tester 202 can then test the one or more dies whose terminals are in contact with the probes 220. The holding mechanism 232 can then reposition the DUT 224 such that terminals 228 of one or more different dies contact the probes 220, and the tester can then test the one or more different dies whose terminals are in contact with the probes 220. The foregoing process of repositioning the DUT 224 and testing dies whose terminals 228 are in contact with the probes 220 can continue until all of the dies of the DUT 224 are tested.

As shown in FIG. 2, the contactor device 214 can include a measurement module 212. Electrical connections 216 through the contactor device 214 can electrically connect the measurement module 212 and the electrical interface 210. In addition, electrical connections 218 can electrically connect the measurement module 212 to ones of the probes 222 (which structurally can be like probes 220). The measurement module 212 can also include an input/output interface 206.

FIG. 3 illustrates a simplified, functional block diagram of an exemplary configuration of the measurement module 212 of FIG. 2 according to some embodiments of the invention. As shown, the exemplary configuration of measurement module 212 shown in FIG. 3 can include a controller 302, a digital memory 306, an electronic counter 304, a time module 320, a force module 308, and a sense module 310. A digital data bus 322 can provide a means of communications among the controller 302, counter 304, memory 306, time module 318, force module 308, and sense module 310. The controller 302 can be any digital processor configured to operate under software control. The term "software" as used herein refers to any machine readable code that can cause a machine to perform a process. For example, the term "software" includes without limitation any form of software, firmware, microcode, etc. Alternatively, the controller 302 can be configured in hardwired logic circuits. As yet another alternative, controller 302 can be configured to operate in part under software control and in part under control of hardwired logic circuits.

A signal 312 to the counter 304 can indicate contact between one or more of the probes 222 and a DUT 224. Alternatively, signal 312 can indicate contact between one or more of the probes 220 and a DUT 224. Signal 312 can thus be activated each time probes 220 and/or 222 are brought into contact with a DUT 224, and counter 304 can maintain a running count of the number of times probes 220/222 contact a DUT 224. Time module 320 can track date and time of day. Each count of contact between the probes 220/222 by counter 304 can thus be associated with a date and time. A variety of information relating to contact between probes 220/222 and a DUT 224 can be stored in memory 306. For example, the date and time of each new contact between probes 220/222 and a DUT 224 can be stored in the memory 306. A record of a series of contacts between probes 220/222 and a DUT 224 along with the date and time of each contact can thus be stored in memory 306. As another example, data can periodically be stored in memory 306 indicating that a particular number of contacts between probes 220/222 and a DUT 224 have occurred. Date and time information can also be stored in memory 306 with the contact information.

Force module 308 can be configured to provide a current at output 314 to one or more of the probes 222 (or probes 220), and sense module 310 can be configured to receive on an input 316 a voltage or voltage differential resulting from the current. Alternatively, force module 308 can be configured to force a voltage or a voltage differential onto one or more of probes 222 (or probes 220), and sense module 316 can be configured to sense a resulting current. The controller 302 can be configured to determine a contact resistance or an approximate contact resistance of one or more of the probes 222 (or probes 220) using principles of Ohm's law. Controller 302 can also be configured to perform other functions, including generally controlling operation of the measurement module 212.

Figure 4:
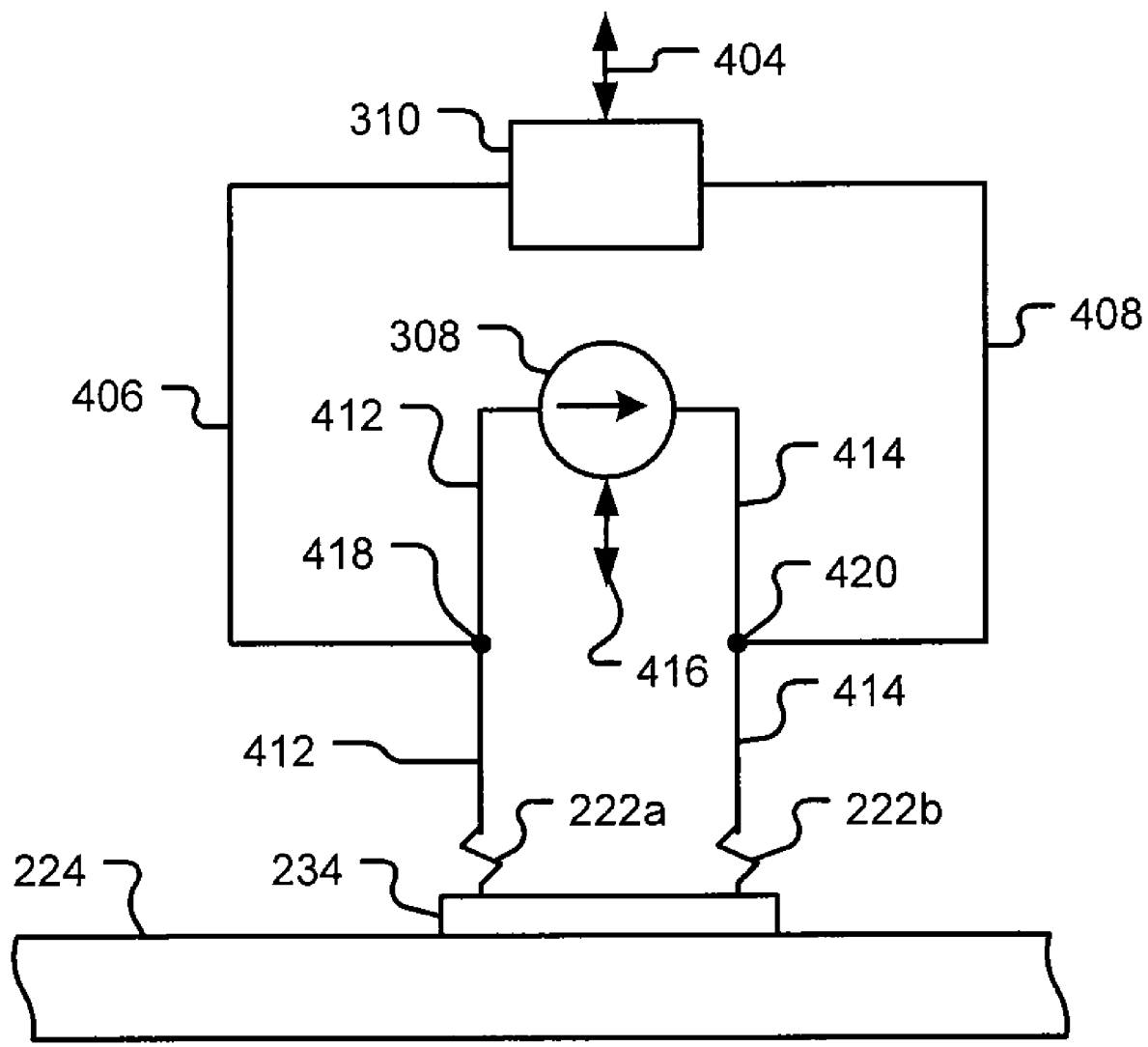
FIG. 4 illustrates an exemplary configuration of a force module and a sense module according to some embodiments of the invention.

FIG. 4 illustrates exemplary configuration and operation of the force module 308 and sense module 310 according to some embodiments of the invention. As shown, force module 308 can be a current source, and an output 414 of force module 308 can be connected to probe 222b (which can be one of probes 222 in FIG. 3). The return 412 of force module 308 can be connected to probe 222a (which can also be one of probes 222 in FIG. 3). Sense module 310 can be a voltage sensor, and inputs of 406, 408 to sense module 310 can be electrically connected to the output 414 and the return 412 of force module 308. The closer the connection points 418, 420 at which the inputs 406, 408 of the sense module 310 are connected to the output 414 and return 412 of the force module 308, the more accurate the determination of the contact resistance of the probes 222a, 222b can be.

The signal input/output 416 associated with force module 308 can include one or more control signals and one or more status signals. For example, signal input/output 416 can include a control signal that powers the force module 308 on or off. As another example, signal input/output 416 can include a control signal that controls the level of current output by the force module 308. As another example, signal input/output 416 can include a status signal indicating whether the force module is powered on or off and a status signal that is proportional to the level of current being output by the force module 308. Similarly, the signal input/output 404 associated with the sense module 310 can include one or more control signals and one or more status signals. For example, signal input/output 404 can include a control signal that powers the sense module 310 on or off. As another example, signal input/output 404 can include a status signal indicating whether the sense module 310 is powered on and a status signal proportional to the voltage between the two inputs 406, 408 of the sense module 310.

As shown in FIG. 4, in operation, probes 222a, 222b can be brought into contact with shorting structure 234 on the DUT 224. Shorting structure 234 can be, for example, conductive material disposed on a surface of the DUT 224. As another example, shorting structure 234 can comprise two terminals 228 of the DUT 224 that are shorted together (e.g., by disposing conductive material between the two terminals 228). Shorting structure 234 can be but need not be electrically connected to circuitry on or in the DUT 224. For example, if DUT 224 is a semiconductor wafer comprising a plurality of dies, shorting structure 234 can comprise conductive material disposed in an unused area of the wafer. For example, shorting structure 234 can comprise conductive material disposed in a scribe street of the wafer. Alternatively, shorting structure 234 can be unused input and/or output terminals 228 that are shorted together. Alternatively, shorting structure 234 need not be included and can be replaced with two terminals 228 that are intended to be fully functional terminals 228 by which the DUT 224 or a device that composes the DUT 224 will be operated during normal end use. For example, two ground terminals 228 or two power terminals 228 of the DUT 224 can be used in place of the shorting structure 234. In some DUTs 224, two ground terminals 228 or two power terminals 228 can be interconnected (e.g., by a ground plane or ground plane) within the DUT 224. DUT terminals 228 other than pairs of ground or power terminals 228 can alternatively be used. For example, a pair of terminals 228 comprising a signal input terminal 228 and a power input terminals 228 can be used. Other alternatives are also possible. For example, shorting structure 234 can be disposed on an object other than a DUT 224. For example, shorting structure 234 can be deposited on a holding plate (not shown), which be disposed on mechanism 232 (see FIG. 2) in place of the DUT 224.

The quotient of the voltage sensed by the sense module 310 divided by the current output by the force module 308 can equal or approximately equal the resistance of the electrical path between connection points 418, 420. The quotient thus can equal or approximately equal the series resistance of the following: the portion of the output 414 between connection point 420 and probe 222b; probe 222b; the portion of the shorting structure 234 between probes 222a and 222b; probe 222a; and the portion of the return 412 between probe 222a and connection point 418.

The exemplary configuration shown in FIG. 4 can be operated to make determinations regarding the contact resistance of the probes 222a, 222b, according to some embodiments of the invention, as follows. Controller 302 (not shown in FIG. 4) can output control signals through signal input/output 404 and signal input/output 416 to power on the force module 308 and the sense module 310. The controller 302 (not shown in FIG. 4) can then output one or more control signals to the force module 308 that cause the force module 308 to output a particular level of current. The controller 302 can then receive from signal input/output 404 a status signal from the sense module 310 that is proportional to a voltage difference between connection points 418, 420. The controller 302 can then find the quotient of the voltage difference between connection points 418, 420 and the level of current output by the force module 308. As discussed above, that quotient can be equal or approximately equal to the resistance of the electrical path between connection points 418, 420 through shorting structure 234.

Because the resistance of the electrical path between connection points 418, 420 includes probes 222a, 222b, the controller 302 can use the resistance of the electrical path between connection points 418, 420 to approximate the contact resistance of the probes 222a, 222b. For example, through calibration procedures, the resistance of the shorting structure 234, the resistance of the portion of the output 414 between connection point 420 and probe 222b, and the resistance of the portion of the return 412 between connection point 418 and probe 222a can be determined or approximated and used as an offset value. Controller 302 can subtract the determined or approximated offset from the calculated resistance of the electrical path between connection points 418, 420 through shorting structure 234 to determine or approximate the contact resistance of the probes 222a, 222b. As another alternative, an array of data relating possible current values that could be output by force module 308 and possible voltage values that could be sensed by sense module 310 to contact resistances of probes 222a, 222b can be stored in memory 306, and controller 302 (see FIG. 3) can use such an array to determine resistance.

Figure 5:
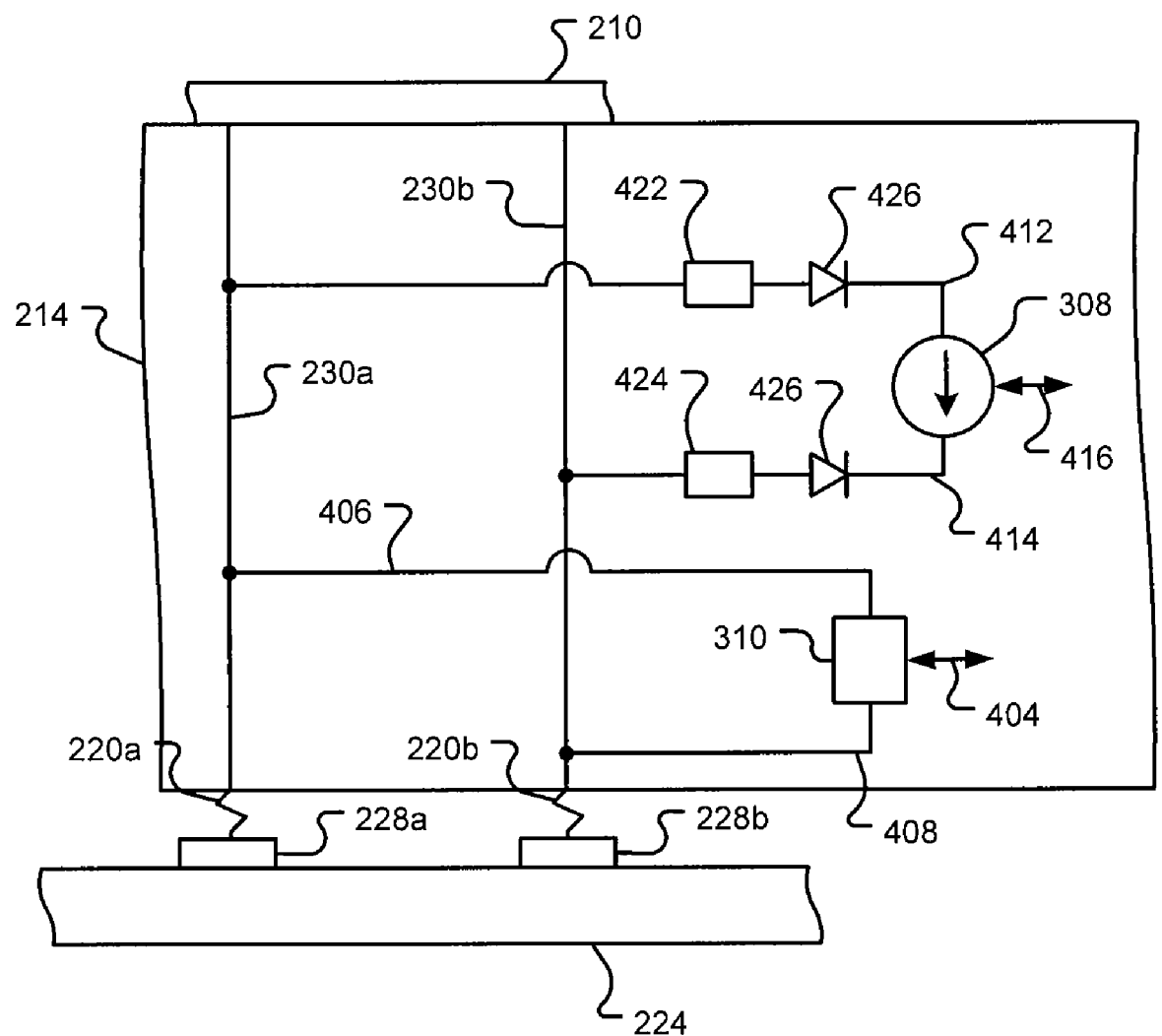
FIG. 5 illustrates an alternative configuration of the force module and sense module according to some embodiments of the invention.

FIG. 5 illustrates a partial view of the contactor device 214 and the DUT 224 illustrating exemplary alternatives to the configuration shown in FIG. 4 according to some embodiments of the invention. Like numbered and named elements in FIGS. 4 and 5 can be the same or similar. In the configuration shown in FIG. 5, the force module 308 can be electrically connected through isolation connectors 422 to a pair of electrical paths 230a, 230b between the electrical interface 210 (shown in partial view in FIG. 5) of the contactor device 214 and two of the probes 220a, 220b. For example, electrical paths 230a, 230b can be ones of the electrical paths 230 illustrated in FIG. 2, and probes 220a, 220b can be ones of the probes 220 shown in FIG. 2. As discussed above with respect to FIG. 2, electrical paths 230a, 230b can carry power, ground, and/or signals to and/or from the DUT 224 during testing of the DUT 224. Isolation connectors 422, 424 can be configured to provide full or partial electrical isolation of the force module 308 from electrical paths 230a, 230b to eliminate or reduce effects of the force module 308 on power, ground, and/or signals on electrical paths 230a, 230b during testing of the DUT 224.

Isolation connectors 422, 424 can be any suitable electrical device that can be configured to eliminate or reduce effects of the force module 308 on power, ground, and/or signals on electrical paths 230a, 230b. For example, isolation connectors 422, 424 can be switches that electrically connect and disconnect the output 414 and return 412 of the force module 308 from electrical paths 230a, 230b. As another example, isolation connectors 422, 424 can comprise capacitors (not shown) that capacitively couple the output 414 and return 412 of the force module 308 to the electrical paths 230a, 230b. As yet another example, isolation connectors 422, 423 can comprise coupling inductors (not shown) that inductively couple the output 414 and return 412 of the force module 308 to the electrical paths 230a, 230b. As also shown in FIG. 5, reverse biased diodes 426 can be provided at the output 414 and return 412 of the force module 308. The reverse biased diodes 426 can be provided when it is desirable that current flow from the force module 308 into paths 230a, 230b only during half cycles.

The inputs 406, 408 of the sense module 310 can be connected directly to electrical paths 230a, 230b as shown in FIG. 5. Alternatively, the inputs 406, 408 of the sense module 310 can be connected to electrical paths 230a, 230b through isolation connectors 422, 424 or through other connectors (e.g., like isolation connectors 422, 424).

Probes 220a, 220b can be brought into contact with two functioning power input, ground input, and/or input and/or output terminals 228a, 228b of DUT 224. Thus, for example, terminals 228a, 228b can be two power input terminals, two ground input terminals, two signal input terminals, two signal output terminals, or any combination of the foregoing (e.g., terminals 228a can be a ground terminal, and terminal 228b can be a signal input terminal of DUT 224). Alternatively, probes 228a, 228b can be brought into contact with a shorting structure (not shown in FIG. 5), for example, like shorting structure 234 of FIG. 4.

Figure 6:
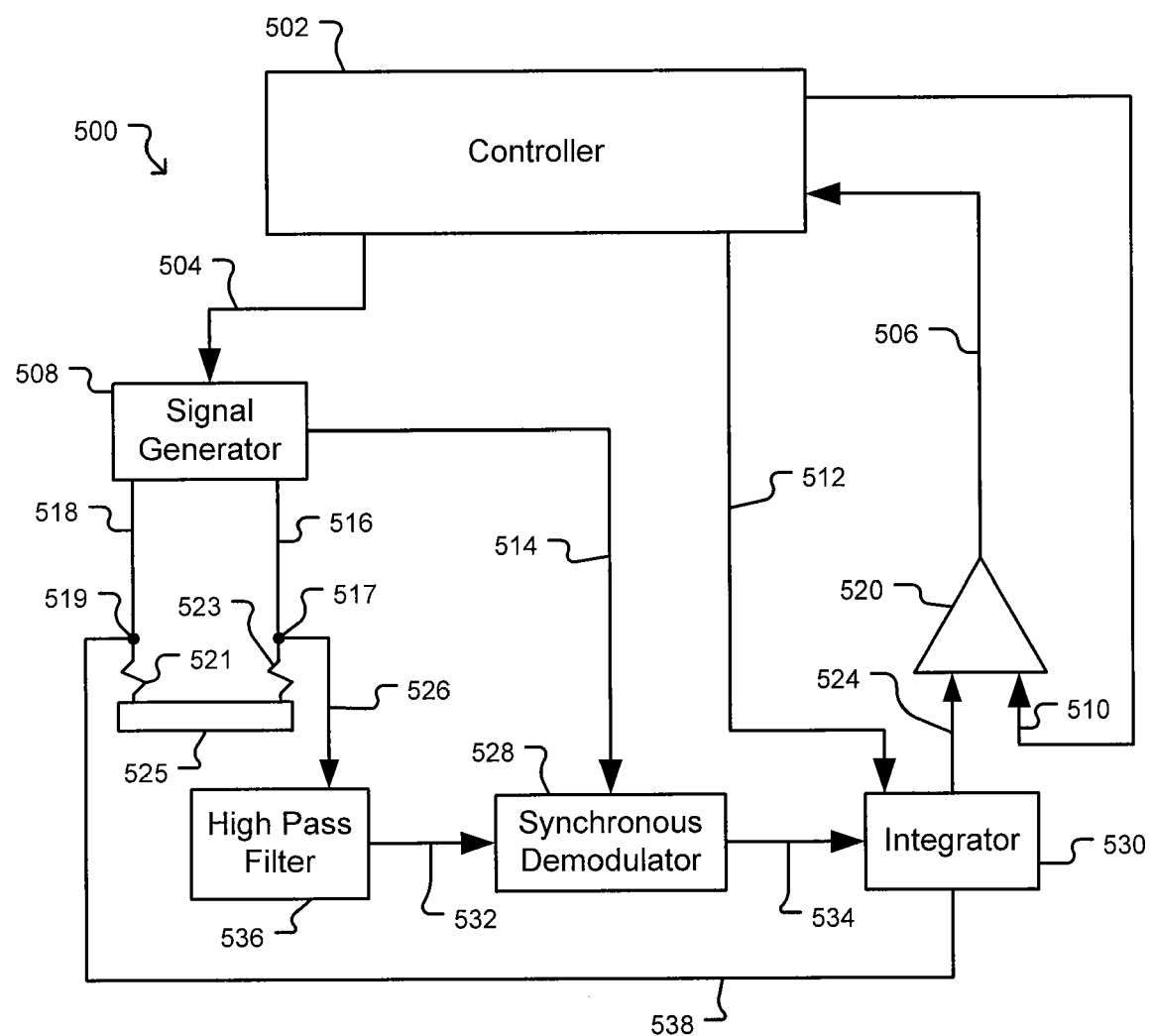
FIG. 6 illustrates another exemplary configuration of the measurement module of FIG. 2 according to some embodiments of the invention.

FIG. 6 illustrates a simplified block diagram of an exemplary milliohm meter circuit 500, which as will be seen, can be an exemplary implementation of the configuration shown in FIG. 4. The milliohm meter circuit 500 can also be an implementation of the configuration shown in FIG. 5. As will be seen, the signal generator 508 in FIG. 6 can be an exemplary implementation of the force module 308 of FIG. 4 (or FIG. 5), and the high pass filter 536, the synchronous demodulator 528, the integrator 530, and the differential amplifier 520 of FIG. 6 can be an exemplary implementation of the sense module 310 of FIG. 4 (or FIG. 5). Controller 502 of FIG. 6 can be generally the same as controller 302 (which is not shown in FIG. 4 but is shown in FIG. 3). Probes 517, 519 can be like probes 222a, 222b in FIG. 4 or probes 220a, 220b in FIG. 5. In some embodiments, the milliohm meter circuit 500 of FIG. 6 can be configured to measure the resistance between points 517, 519 to within about one milliohm.

As shown in FIG. 6, milliohm meter circuit 500 can include a controller 502, which can be generally similar to controller 302 and can be configured to control operation of the milliohm meter circuit 500. Milliohm meter circuit 500 can also include a signal generator 508 with an output 516 and a return 518. The output 516 can be terminated in a probe 523, and the return 518 can be terminated in another probe 521. As shown, the probes 521, 523 can be pressed against a shorting structure 525, which can be like shorting structure 234. Probes 521, 523 can be like probes 220, 222, and the shorting structure 525 can be like shorting structure 234 of FIGS. 2 and 4 or, alternatively, replaced by terminals 228a, 228b of FIG. 5. The signal generator 508 can also include line 514 over which the signal generator 508 can provide synchronizing signals to a synchronous demodulator 528.

The milliohm meter circuit 500 can also include a high pass filter 536, a synchronous demodulator 528, an integrator 530, and a differential amplifier 520. As shown in FIG. 6, the connection pints 517, 519 can be near probes 521, 523. Configured as a current source, signal generator 508 can output a current that flows through the probes 521, 523 and shorting structure 525, which results in a voltage between points 517, 519, and thus across generally the probes 521, 523 and shorting structure 525, in accordance with Ohm's law. As shown in FIG. 6, an input 526 of high pass filter 536 can be electrically connected to the output 516 of the signal generator such that the voltage across the probes 521, 523 and shorting structure 525 is an input 526 to the high pass filter 536. The high pass filter 536 can filter direct current and low frequency components from the voltage across the probes 521, 523 and shorting structure 525. A line 532 can electrically connect the output of the high pass filter 536 to the input of a synchronous demodulator 528, which can eliminate noise components from and rectify the signal output to line 532 from the high pass filter 536.

As shown, the output of the synchronous demodulator 528 can be electrically connected to the input of the integrator 530 by line 534, and line 524 can electrically connect the output of the integrator 530 to an input of a differential amplifier 520. A reference signal from the controller 502 can be the other input 510 to the differential amplifier 520, whose output 506 can be electrically connected to the controller 502. Controller 502 can provide one or more control signals on line 512 to the integrator 530. In addition, as shown, a return line or ground connection 538 from the integrator 530 can be electrically connected at connection point 519 to the return 518 of the signal generator 508.

Figure 7:
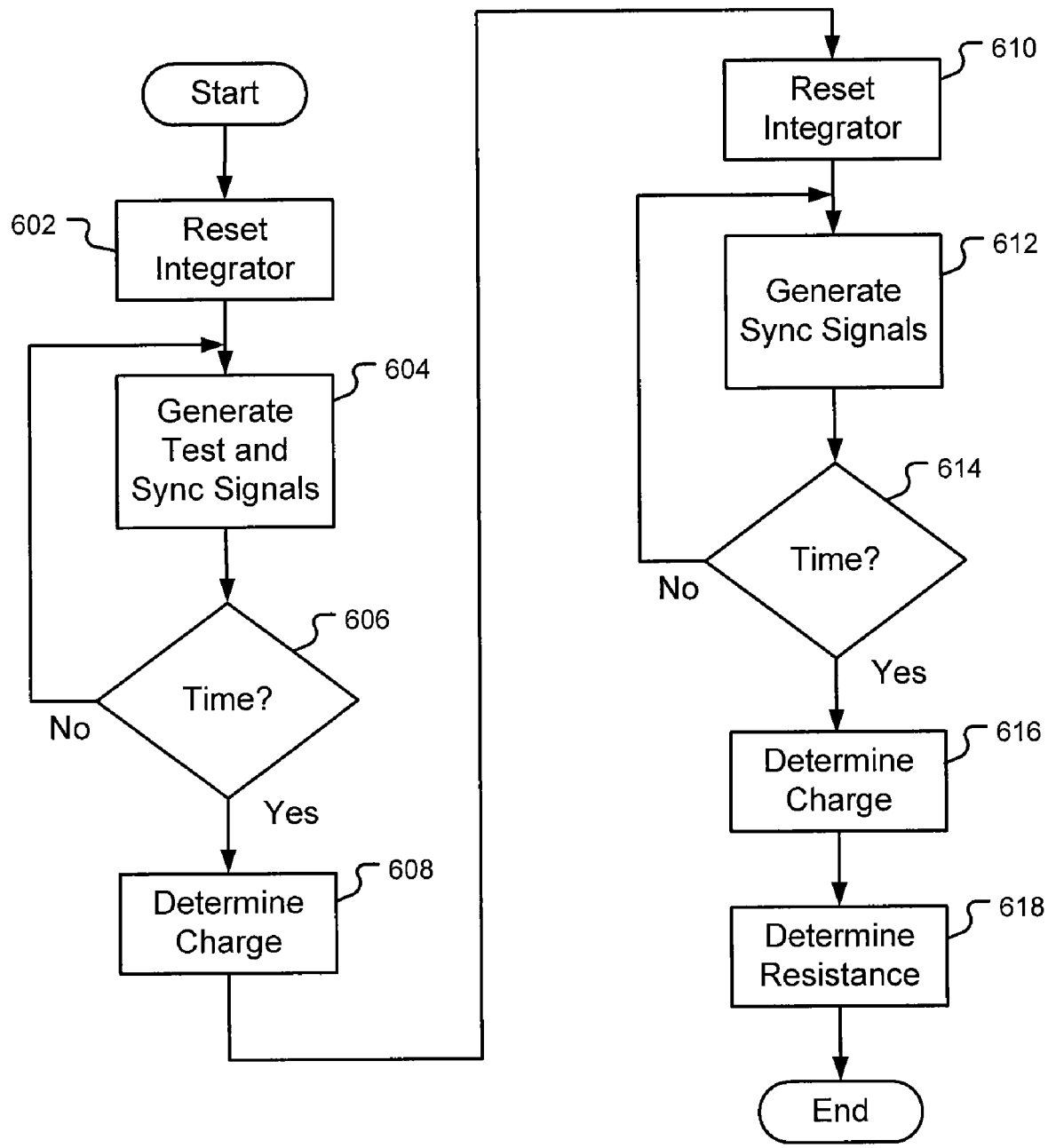
FIG. 7 illustrate exemplary operation of the configuration of FIG. 6.
Figure 8:
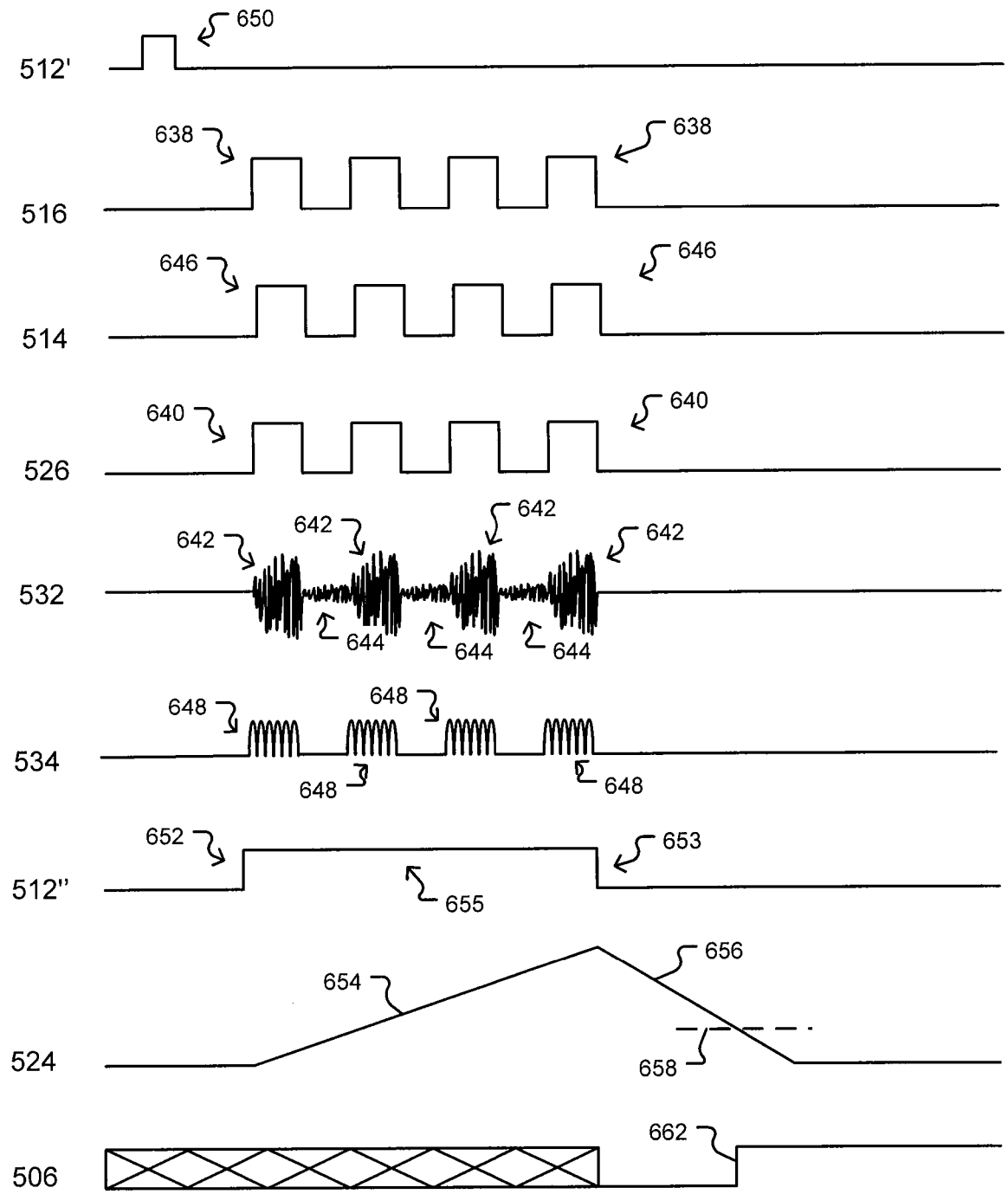
FIG. 8 illustrates exemplary signal patterns generated during exemplary operation of the configuration shown in FIG. 6.

FIG. 7 illustrates exemplary operation of the milliohm meter circuit 500 to determine a resistance of the electrical path between connection points 517, 519 through the shorting structure 525, and FIG. 8 illustrates exemplary signal patterns in the milliohm meter circuit 500 during the operation shown in FIG. 7. The process shown in FIG. 7 can be performed by the controller 502 operating under software control. Alternatively, controller 502 can be hardwired to perform the process shown in FIG. 7. As yet another alternative, controller 502 can comprise a combination of hardwired logic and software control.

As shown in FIG. 7, the integrator 530 can be reset at 602. For example, controller 502 can output a control signal on line 512 that resets the integrator 530. For example, the controller 502 can output over line 512 the exemplary reset pulse 650 shown in FIG. 8. At 604, the signal generator 508 can generate on output 516 (which can be returned on return 518) a series of current pulses and on line 514 corresponding synchronizing pulses. As shown by 604 and 606, the signal generator 508 can output the current pulses and synchronizing pulses for a predetermined period of time.

FIG. 8 illustrates examples of current pulses 638 that signal generator 508 can generate on output 516 and synchronizing pulses 646 that signal generator 508 can output on line 514. The current pulses 638 and the synchronizing pulses 646 can be output at any frequency, including, for example, 1 kilohertz. One kilohertz is exemplary only, however, and the pulses 638 and 646 can be output at other frequencies. For example, in some embodiments current pulses 638 and synchronizing pulses 646 can be output at a frequency above the loop frequency of the power supply (not shown) supplying power to the DUT 224. If the current pulses 638 and synchronizing pulses 646 have a frequency above the loop frequency of the power supply (not shown), the configuration shown in FIG. 5 can be operated without isolation devices 422, 424. For example, the process of FIG. 7 can be performed to determine or approximate the resistance of probes while power is being supplied through the probes to the DUT.

In some embodiments, signal generator 508 can be implemented such that it generates a burst of voltage pulses (e.g., 5 volts peak-to-peak), which are converted into current pulses at the output 516 of the signal generator 508. For example, the signal generator 508 can internally drive a burst of voltage pulses into a PNP switching transistor (not shown) that is in saturation, which can cause the transistor's collector (not shown) to deliver voltage pulses with steady, consistent voltage levels to a resistor (not shown) located in the signal generator 508 at output 516, which can result in a steady flow of current through the resistor (not shown) during each voltage pulse. Regardless of how the current pulses 638 of FIG. 8 are generated, the current pulses 638 can generate voltage pulses between points 517 and 519 and thus on input 526 in FIG. 6. Examples of such voltage pulses resulting from current pulses 638 are depicted as voltage pulses 640 in FIG. 8.

As shown in FIG. 6, the voltage pulses 640 can be provided to the input 526 of the high pass filter 536, which can output onto line 532 filtered pulses, such as the exemplary filtered pulses 642 shown in FIG. 8. The filtered pulses 642 can comprise a mixture of noise and the high frequency components of the voltage pulses 640. Noise is also shown present during the time periods 644 between filtered pulses 642. Synchronous demodulator 528 can eliminate most or all of the noise from the filtered pulses 642 and can further rectify the filtered pulses 642, which can be output onto line 534. Examples of rectified signal groups 648 corresponding to the filtered pulses 642 output on line 534 by the synchronous demodulator 528 are shown in FIG. 8. The controller 502 can enable the integrator 530 at the time the signal generator 508 begins to output current pulses 638 and synchronizing pulses 646 so that the integrator 530, which as shown in FIG. 6 receives as input from line 534 the rectified signal groups 648, integrates (e.g., sums) the rectified signal groups 648. FIG. 8 shows an example in which the rising edge 652 of an enable signal 655 provided over line 512 to the integrator 530 occurs as the signal generator 508 starts outputting current pulses 638. In FIG. 8, the rising slope 654 shows a rising level of the output of integrator 530 into line 524 as the integrator 530 sums the rectified signal groups 648. As should be apparent, the signals 648 output onto line 534 by the synchronous demodulator 528 correspond to the voltage pulses 640 produced by the current pulses 638 output 516 by the signal generator 508, and the integrated sum of signals 648 generated by the integrator 530 and output onto line 524 represents a sum of the voltage generated across points 517, 519 by the current pulses 638 output 516 by the signal generator 508.

Once the time period ends at 606 in FIG. 7, the controller 502 can cause the signal generator 508 to stop outputting the current pulses 638. Although four current pulses 638 are shown in FIG. 8, more or fewer can be output 516 by the signal generator 508 before time expires at 606 of FIG. 7. More or fewer than four corresponding voltage pulses 640, filtered pulses 642, synchronizing pulses 646, and rectified signal groups 648 can also be generated (see FIG. 8). Once the time period ends at 606 in FIG. 7, the controller 502 can also disable the integrator 530 so that it stops integrating signals appearing on line 534. For example, as shown in FIG. 8, the controller 502 can deactivate the enable signal 655 on line 512 so that the falling edge 653 of the enable signal 655 coincides generally with the end of the last current pulse 638 generated by the signal generator 508. As shown by falling slope 656 in FIG. 8, the signal output onto line 524 by the integrator 530 can begin to fall as the charge built up on the integrator (corresponding to the sum of the rectified signal groups 648) discharges.

Referring again to FIG. 7, after it is determined at 606 that the specified time period has expired, the level of charge built up on the integrator 530 by the current pulses 638 output 516 by the signal generator 508 during 604 and 606 can be determined. Controller 502 can determine the level of charge that built up on integrated 530 by determining the amount of time the integrator 530 takes to discharge to a predetermined voltage level. For example, as shown in FIG. 8, controller 502 can count the time between the falling edge 653 of the integrator enable signal 655 (which as discussed above can correspond to the time the integrator 530 begins to discharge) to the time the output of the integrator 530 onto line 524 falls to a predetermined level (indicated by reference level 658 in FIG. 8), at which time the differential amplifier 520 can activate 662 (see FIG. 8) its output 506 (see FIG. 6), indicating that the charge on the integrator 530 has fallen to the reference level 658.

As discussed above, the charge built up on integrator 530 by current pulses 638 can be proportional to the total voltage induced between points 517, 519 by the current pulses 638 generated by the signal generator 508 (see FIGS. 6 and 8). Because the amount of current in the current pulses 638 is known, the resistance between points 517, 519 can be determined by dividing the total voltage induced between points 517, 519 by the total current in the current pulses 638 in accordance with Ohm's law. As can be seen in FIG. 6, the resistance between points 517, 519 includes probes 521, 523 and can thus be used to determine, estimate, or approximate the resistance of the probes 521, 523 and/or changes in the resistance of the probes 521, 523 over time.

In some embodiments, the accuracy of the foregoing resistance determination can be improved by repeating steps 602-608 without generating the current pulses 638. An example is shown by 610 to 618 in FIG. 7. As shown in FIG. 7, the integrator 530 can be reset at 610, and the signal generator can generate synchronous signals (e.g., 646 in FIG. 8) (but not current pulses 638 in FIG. 8) at 612 for a specified period of time as shown by 612, 614 of FIG. 7. The time in 614 can be the same as the time in 606. Once the time expires at 614, the charge built up on the integrator 530 can be determined at 616. Note that 610, 612, 614, 616 can be the same as or generally similar to 602, 604, 606, 608 except at 612, the signal generator 508 generates both current pulses 638 and synchronous signals 646, while in contrast, the signal generator 508 generates synchronous signals 646 but not current pulses 638 at 612. The charge determined at 616 can be an offset value that can be subtracted from the charge determined at 608. For example, the charge determined at 616 can be charge on the integrator 530 that is not from the current pulses generated by the signal generator 508, which can be subtracted from the charge determined at 608 to determine or approximate the charge built up on the integrator 530 due to the current pulses produced by the signal generator 508 during 604, 606.

At 618, information relating to the contact resistance of the probes 521, 523 can be determined or approximated. As mentioned, the difference between the charge determined at 608 and the charge determined at 616 can be or can approximate a charge built up on integrator 530 due to the current pulses generated by the signal generator 508 during 604, 606. That charge can be proportional to a voltage difference between connection points 517, 519 caused by the current pulses. As discussed above, the amount of current in the current pulses can be proportional to a level of the control signal generated by the controller 502 and input 504 to the signal generator 508. Using principles based on Ohm's law, as discussed above, the controller 502 can determine the resistance of the path between connection points 517, 519 through the shorting structure 525. For example, the controller 502 can determine the quotient of the voltage difference between connection points 517, 519 divided by the amount of current in the current pulses. As another alternative, controller 502 can retrieve data corresponding to contact resistance of the path between connection points 517, 519 from an array of values stored in a memory associated with the controller 502, as generally discussed above with respect to controller 302. The information regarding contact resistance of the probes 521, 523 generated at 618 can be sent to a tester (e.g., like tester 102 of FIG. 1 or 202 of FIG. 2). Alternatively, the resistance information can be output or transmitted to other devices or equipment. As yet another alternative, the resistance information can be stored locally and later retrieved by a user.

As generally discussed above, the controller 502 can use the calculated or estimated resistance of the path between connection points 517, 519 in various ways. For example, calibration values can be predetermined and stored in a memory associated with the controller 502. Such calibration values can be used to adjust the calculated or estimated resistance of the path between connection points 517, 519 to include only or essentially only the resistance of the probes 521, 523. As another example, the controller 502 can perform the process of FIG. 7 periodically and can store each resulting determination of the resistance of the path between connection points 517, 519. Several such determinations made over time can then be analyzed—by the controller 502 or otherwise—to determine change patterns in the resistance. In some uses, the resistance of the probes 521, 523 is the most likely portion of the resistance of the path between connection points 517, 519 to change over time. Thus, in some uses, much or all of the change in the resistance of the path between connection points 517, 519 can be attributed to changes in the resistance of the probes 521, 523.

Figure 9:
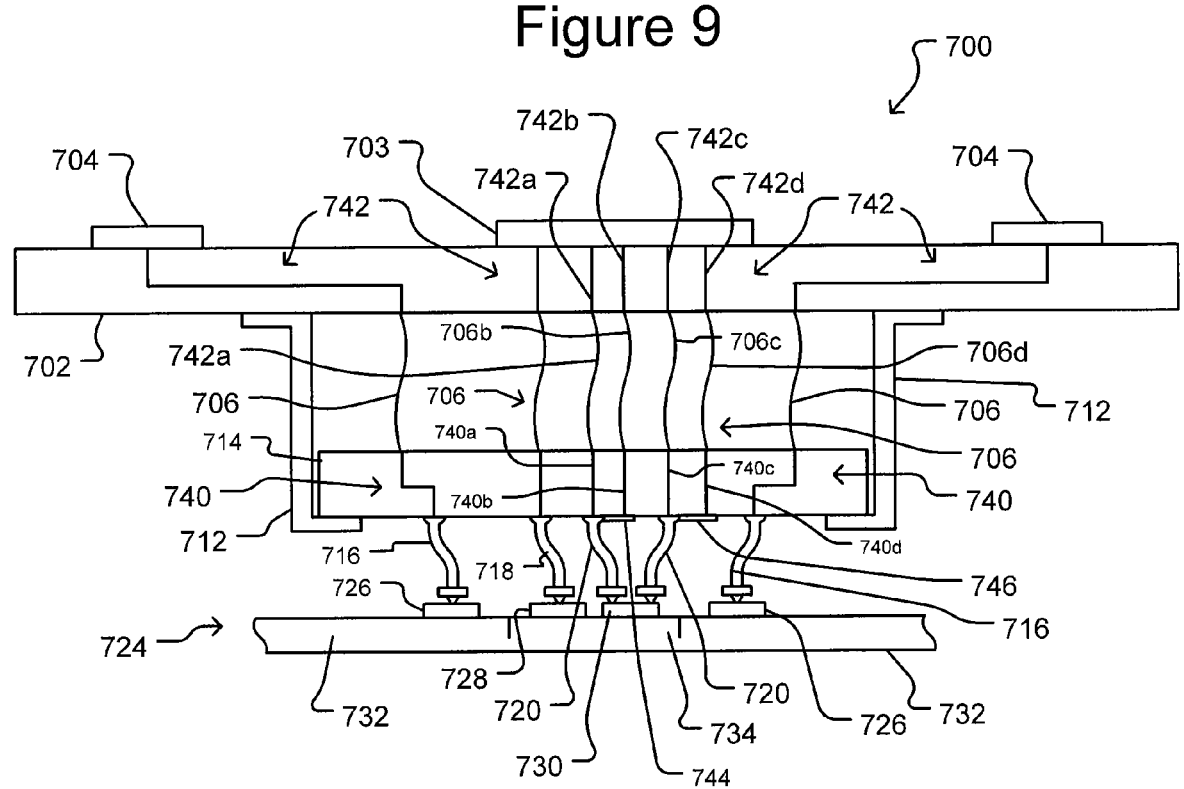
FIG. 9 illustrates an exemplary probe card assembly configured with a measurement module according to some embodiments of the invention.

FIG. 9 illustrates an exemplary probe card assembly 700 that includes a measurement module 703 according to some embodiments of the invention. The probe card assembly 700 of FIG. 9 is a non-limiting example of the contactor device 214 of FIG. 2. In addition, the probe card assembly 700 can be used in a semiconductor probing system, like system 100 of FIG. 1. For example, the probe card assembly 700 of FIG. 9 could be used n place of the probe card assembly 114 in FIG. 1, in which case the DUT 724 of FIG. 9 could replace the wafer 130 of FIG. 1. The measurement module 703 on the probe card assembly 700 can be like the measurement module 212 of FIGS. 2 and 3. The measurement module 703 can thus be configured as shown in FIG. 4 or FIG. 5.

As shown in FIG. 9, the probe card assembly 700 can include a wiring substrate 702 with an electrical interface 704. The wiring substrate 702 can comprise a wiring board, such as a printed circuit board. The electrical interface 704 can be configured to make electrical connections with the connectors 108 in FIG. 1. The electrical interface 704 can comprise electrical connectors (e.g., zero insertion force connectors, pogo pin pads, etc.). As also shown in FIG. 9, the wiring substrate 702 can include a plurality of electrical paths 742, which can comprise electrically conductive traces and/or vias on, in, and/or through the wiring substrate 702. Although not shown in FIG. 9, electrical paths can be provided between the electrical interface 704 and the measurement module 703.

As can also be seen in FIG. 9, the probe card assembly 700 can include a probe head assembly 714 with electrically conductive probes 716 disposed to contact input and/or output terminals 726 on a DUT 724. Probes 716 can be like probes 220 of FIG. 2. In addition, DUT 724 can be like DUT 224. The probe head assembly 714 can be attached to the wiring substrate 702 by attachment mechanisms 712, which can be brackets, bolts, screws, etc. The probe head assembly 714 can include electrically conductive paths 740 through the probe head assembly 714 as shown in FIG. 9. The paths 740 can comprise electrically conductive traces and/or vias on, in, and/or through the probe head assembly 714. A plurality of flexible electrical connections 706 can electrically connect the paths 742 of the wiring substrate 702 with paths 740 of the probe head assembly 714. Ones of the probes 716 can thus be electrically connected with the electrical interface 704. The flexible electrical connections 706 can be as simple as flexible wires or more complex, such as an interposer structure.

As shown in FIG. 9, the probe card assembly 700 can also include a probe 718 configured to contact a feature 728 on the DUT 724. Probe 718 can be electrically connected through paths 740, flexible electrical connections 706, and paths 742 to the measurement module 703 and can provide a touch down input (e.g., like 312 of FIG. 3) to a counter (not shown but can be like 304 of FIG. 3) in the measurement module 703. That is, the probe card assembly 700 can be configured such that an electrical signal is provided to the measurement module 703 each time the probe 718 makes contact with a feature 728 on a DUT 724. The measurement module 703 can thus track, monitor, and/or store information regarding the number of times probes 716 of the probe card assembly 700 are brought into contact with a DUT (e.g., like DUT 724) as discussed above with respect to FIG. 3.

As also shown in FIG. 9, the probe card assembly 700 can include probes 720 configured to contact a shorting structure 730. Probes 720 can be like and can be configured like probes 222a, 222b of FIG. 4 or probes 521, 523 of FIG. 5, and shorting structure 730 can be like shorting structure 234 of FIG. 4 or shorting structure 525 of FIG. 5. The probes 720 can be electrically connected to a force module (not shown in FIG. 9 but can be like force module 308 of FIG. 3 or FIG. 4 or signal generator 508 of FIG. 5) in the measurement module 703. As shown in FIG. 9, probes 720 can be electrically connected to the measurement module 703 through paths 740a, 740c, flexible electrical connections 706a, 706c, and paths 742a, 742c. Path 740a, connection 706a, and path 742a can thus be like output 414 of FIG. 4 or output 516 of FIG. 5. Similarly, path 740c, connection 706c, and path 742c can be like return 412 of FIG. 4 or return 518 of FIG. 5.

Paths 740b, 740d, flexible electrical connections 706b, 706d, and paths 742b, 742d can provide electrical connections from electrical traces 744, 746 on the probe head assembly 714 to inputs of a sense module in measurement module 703. Although not shown in FIG. 9, the sense module of measurement module 703 can be like sense module 310 of FIG. 3 or FIG. 4, or the high pass filter 536, synchronous demodulator 528, integrator 530, and differential amplifier 520 of FIG. 5. Path 740b, flexible electrical connection 706b, and path 742b can thus be like input 408 to sensor 310 or input 526 to the high pass filter 536 of FIG. 5. Similarly, path 740d, flexible electrical connection 706d, and path 742d can be like input 406 to sensor 310 in FIG. 3 or line 538 in FIG. 5.

As shown in FIG. 9, traces 744, 746 can be electrically connected to the probes 720. The traces 744, 746 can thus provide connection points for the inputs to the sense module (not shown) in the measurement module 703. Traces 744, 746 can provide the connection points 418, 420 in FIG. 4 and the connection points 517, 519 in FIG. 5.

In the example shown in FIG. 9, DUT 724 comprises a plurality of electronic devices 732 separated by an unused area 734. (Although two devices 732 and one unused area 743 are shown, more can be provided.) For example, DUT 724 can be a semiconductor wafer and devices 732 can be dies. The unused area 734 can be a scribe street between the dies 732 provided to allow the dies to be singulated into individual dies. As shown, the feature 728 and the shorting structure 730 can be disposed on the DUT 724 in the unused area 734.

It should be apparent that the points or locations at which current or voltage is forced and at which the other of current or voltage is measured to make a determination regarding the contact resistance of probes as well as the force module and the sense module can be on the contactor device 214 in FIG. 2 and on the probe card assembly 700 in FIG. 9. Indeed, the force module (e.g., 308, 508) and the sense module (e.g., 310 and 536, 528, 530) and the locations where current or voltage is forced and where the other of current or voltage is sensed can be located with a few inches or, in some configurations, even closer to the probes whose contact resistance is being measured. The measurement module 212 can be located within about an inch to two inches from the probes 222 in FIG. 2. The measurement module 703 in FIG. 9 can be located within an inch or two inches of the probes 720 whose resistance is measured. Thus, in some embodiments, the force module (e.g., 308, 508) and the sense module (e.g., 310 and 536, 528, 530) and the locations where current or voltage is forced and where the other of current or voltage is sensed can be located with a few inches or even closer to the probes whose contact resistance is being measured. Non-limiting examples include locating the force module and the sense module and the locations where current and voltage are forced or sensed can be within any of the following of the probes whose resistance is being measured: one inch, two inches, three inches, four inches, five inches, six inches, etc.

Figure 10:
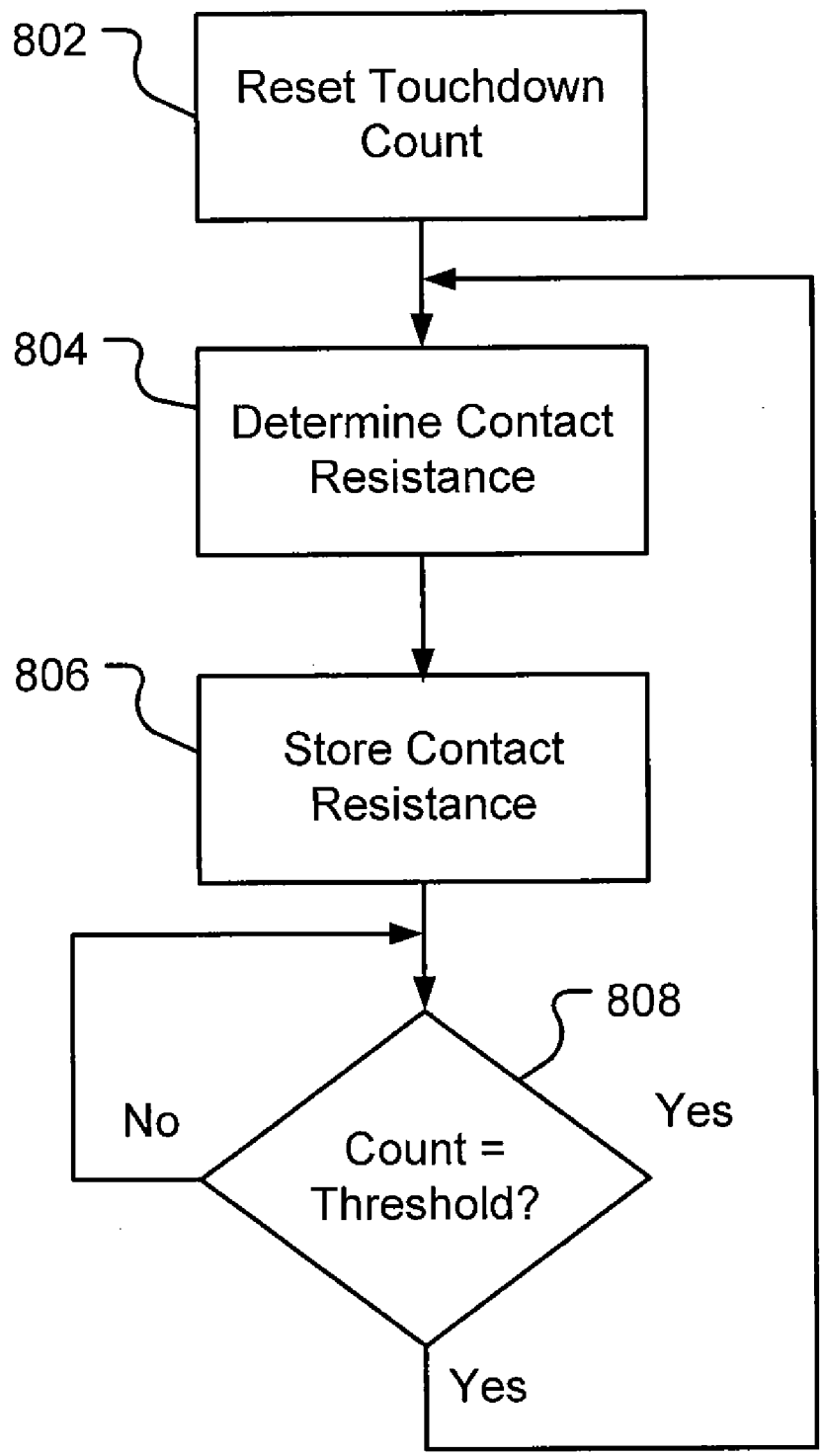
FIG. 10 illustrates exemplary operation of the measurement module of the probe card assembly of FIG. 9.

FIG. 10 illustrates an exemplary process that can be performed by the measurement module 703 of the probe card assembly 700 while the probe card assembly 700 is used in a test system like system 100 of FIG. 1 to test a DUT like DUT 724 of FIG. 9. For example, the probe card assembly 700 can be attached to the prober 132 in FIG. 1 in place of the probe card assembly 114. A DUT like DUT 724 of FIG. 9 can be placed on the chuck 134 and brought into contact with probes 716, 718, 720 of the probe card assembly 700. The tester 102 can then test the DUT 724 by generating test signals that are provided to the DUT 724, as generally discussed above, and evaluating response signals generated by the DUT 724 in response to the test signals. As also discussed above, it may be necessary to reposition the DUT 724 one or more times and repeat testing with each reposition in order to test all the electronic devices that can compose the DUT 724. Once the DUT 724 is completely tested, the DUT 724 can be removed from the prober 132, and a new DUT (e.g., similar to DUT 724) can be placed on the chuck 134, and the process of testing can be repeated on the new DUT. Many DUTs can be tested in this way.

While DUTs are being tested as described above, the measurement module 703 of probe card assembly 700 can perform the exemplary process shown in FIG. 10, according to some embodiments of the invention. At 802, the current count of touch downs between probe 718 and feature 728 can be reset. At 804, 806, the measurement module 703 can determine information relating to a contact resistance of probes 720 using any of the methods discussed above (for example, with respect to FIGS. 2-9) and store the information in a memory. At 806, the process of FIG. 10 can wait until the current count of touch downs between probe 718 and a feature 728 on a DUT 724 reaches a threshold number, after which, the process of FIG. 10 can be repeated by resetting the touch down count at 802, determining information relating to contact resistance of probes 720 at 804, and storing the resistance information at 806. In this way, the measurement module 703 can be configured to determine and store information regarding the contact resistance of the probes 720, 722 every threshold number of touchdowns of the probe 718 on a feature 728. Although not shown in FIG. 10, the level of contract resistance of the probes can be used to determine when to clean the probes. For example, the level of contact resistance of the probes measured or estimated can be monitored over time, and the probes can be cleaned when the contact resistance exceeds a given threshold.

Although specific embodiments and applications of the invention have been described in this specification, there is no intention that the invention be limited to these exemplary embodiments and applications or to the manner in which the exemplary embodiments and applications operate or are described herein.

I claim:

1. A method of determining the resistance of probes on a contactor device, the method comprising:
    bringing the contactor device into contact with a shorting structure so that at least a pair of the probes are electrically connected to the shorting structure;
    forcing a plurality of current pulses through the probes and the shorting structure to induce a corresponding plurality of voltage pulses across said probes;
    determining a total current associated with the plurality of current pulses;
    determining a total voltage associated with the plurality of voltage pulses; and
    estimating a resistance of the probes from the total voltage and the total current to obtain an estimated resistance.

2. The method of claim 1, wherein the shorting structure comprises interconnected power pins of a semiconductor device.

3. The method of claim 2, further comprises supplying power to the semiconductor device through the probes using a power supply.

4. The method of claim 3, wherein the supplying power and the forcing a plurality of current pulses are performed simultaneously.

5. The method of claim 4, wherein the forcing a plurality of current pulses comprises outputting current pulses at a frequency greater than a loop frequency of the power supply.

6. The method of claim 1, wherein the determining a total voltage comprises high pass filtering the voltage pulses.

7. The method of claim 1, wherein the determining a total voltage comprises synchronously demodulating the voltage pulses.

8. The method of claim 1, wherein the determining a total voltage comprises integrating the voltage pulses.

9. The method of claim 1, further comprising:
    repeating each of the forcing a plurality of curent pulses, the determining a total current, the determining a total voltage, and the estimating a resistance to obtain a plurality of resistance estimates; and
    comparing the resistance estimates.

10. The method of claim 1, further comprising outputting the estimated resistance to a tester electrically coupled to the contactor device.

11. The method of claim 1, further comprising storing the estimated resistance in a memory on the contactor device.

12. The method of claim 1, further comprising:
    determining a total offset voltage when no current pulses are forced through the probes; and
    wherein estimating a resistance comprises subtracting the total offset voltage from the total voltage.

13. The method of claim 1, wherein the determining a total voltage comprises synchronously demodulating the plurality of voltage pulses using a synchronous demodulator and integrating the plurality of voltage pulses using an integrator.

14. The method of claim 1, wherein the forcing the plurality of current pulses comprises driving the current in a same direction for each pulse.

15. A method of determining the resistance of probes on a contactor device, the method comprising:
    pressing a pair of probes against a shorting structure;
    outputting a series of current pulses over a time period so that the current pulses flow through the probes and the shorting structure and result in a series of voltage differences between the probes;
    high pass filtering the series of voltage differences to produce a filtered voltage;
    synchronously demodulating the filtered voltage to produce a rectified voltage;
    integrating the rectified voltage for the time period to produce a total voltage;
    determining a resistance estimate associated with the probes based on the total voltage.

16. The method of claim 15, wherein the determining a resistance estimate comprises dividing the total voltage by a total current of the series of current pulses.

17. The method of claim 15, further comprising:
    determining an offset value by integrating over a second time period during which no current pulses are output; and
    wherein determining a resistance estimate comprises subtracting the offset value from the total voltage.

18. The method of claim 15, wherein the shorting structure comprises interconnected power pins of a semiconductor device.

19. The method of claim 18, further comprising supplying power to the semiconductor device through the probes using a power supply.

20. The method of claim 19, wherein the supplying power and the outputting a series of current pulses are performed simultaneously.

21. The method of claim 19, wherein the outputting a plurality of current pulses comprises outputting the plurality of current pulses at a frequency greater than a loop frequency of the power supply.

22. The method of claim 15, further comprising outputting the resistance estimate to a tester electrically coupled to the contactor device.

23. The method of claim 15, further comprising storing the resistance estimate in a memory on the contactor device.

24. The method of claim 15, wherein the current flow through the probes is in a same direction for each pulse.

* * * * *